(12) United States Patent
Petigny et al.

(10) Patent No.: US 8,487,793 B2
(45) Date of Patent: Jul. 16, 2013

(54) DEVICE AND METHOD FOR PROCESSING AN ANALOGUE SIGNAL

(75) Inventors: Roger Petigny, Meylan (FR); Hugo Gicquel, Grenoble (FR); Sophie Minot, Grenoble (FR)

(73) Assignee: STMicroelectronics SA, Grenoble (FR)

( * ) Notice: Subject to any disclaimer, the term of this patent is extended or adjusted under 35 U.S.C. 154(b) by 143 days.

(21) Appl. No.: 13/242,675

(22) Filed: Sep. 23, 2011

(65) Prior Publication Data

US 2012/0098684 A1 Apr. 26, 2012

(30) Foreign Application Priority Data

Oct. 26, 2010 (FR) ...................................... 10 58761

(51) Int. Cl.
*H03M 1/06* (2006.01)
(52) U.S. Cl.
USPC ............ 341/118; 341/120; 341/161; 341/162

(58) Field of Classification Search
USPC .................................................. 341/118, 161
See application file for complete search history.

(56) References Cited

U.S. PATENT DOCUMENTS

| | | | | |
|---|---|---|---|---|
| 6,489,904 B1 * | 12/2002 | Hisano | .......................... | 341/120 |
| 6,563,445 B1 * | 5/2003 | Sabouri | .......................... | 341/120 |
| 6,606,042 B2 * | 8/2003 | Sonkusale et al. | ............ | 341/120 |
| 6,861,969 B1 * | 3/2005 | Ali | ................. | 341/161 |
| 7,595,744 B2 * | 9/2009 | Agarwal et al. | ............... | 341/118 |
| 7,663,516 B1 * | 2/2010 | Chandra | ....................... | 341/120 |

\* cited by examiner

*Primary Examiner* — Khai M Nguyen
(74) *Attorney, Agent, or Firm* — Slater & Matsil, L.L.P.

(57) ABSTRACT

Device for processing an analogue signal, comprising an analogue-digital converter with a pipelined architecture having an offset, and compensation means configured to compensate for the said offset, the said compensation means comprising digital correction means configured to correct the integer portion of the offset based on the digital signal delivered by the analogue-digital converter, and analogue correction means included in the last stage of the analogue-digital converter and configured to correct the decimal portion of the offset.

20 Claims, 2 Drawing Sheets

DEVICE AND METHOD FOR PROCESSING AN ANALOGUE SIGNAL

CROSS-REFERENCE TO RELATED APPLICATIONS

This application claims the priority benefit of French Patent Application Number 10-58761, filed Oct. 26, 2010, entitled "Device and Method for Processing an Analogue Signal," which is hereby incorporated by reference to the maximum extent allowable by law.

TECHNICAL FIELD

The invention relates to the processing of an analogue signal, and in particular the conversion of such a signal to a digital signal.

BACKGROUND

Currently, analogue-digital converters with pipelined architecture are used to convert analogue signals to digital signals. These converters comprise several stages each of which receives an analogue signal and delivers as an output on the one hand a digital word in the direction of a digital processing unit, and on the other hand a residual analogue signal in the direction of the next stage. The digital processing unit receives the digital words from each stage, based on which it generates a final word corresponding to the analogue signal received as an input. When the analogue-digital converter has a resolution of "n bits", it is said that it converts the values of the input analogue signal to corresponding digital words of n bits.

In general, during the analogue-digital conversion of an input signal, an offset of the output digital signal relative to the input analogue signal appears and can disrupt the performance of the converter. This offset is due to the fact that the various elements of the stages of the converter are not perfect, in other words identical elements contained in different stages do not strictly have the same behavior, mainly because of the differences arising from the manufacture of the elements. These offsets can generate errors in the payload frequency band of the signal.

Specifically, an ideal analogue-digital converter should be able to strictly convert a zero analogue signal to a zero digital word. It turns out that, if a standard converter is short-circuited, and that several output digital values of the converter are measured, the average of the measurements is not zero. Therefore the offset is called the difference between the desired signal and the signal actually delivered by the converter.

Certain techniques make it possible to correct this offset. It is possible to cite for example the retroactive analogue method which consists in digitally measuring the offset of an analogue-digital converter and then in converting this digital measurement, with the aid of a digital-analogue converter of the same resolution to an analogue value. This analogue value that is obtained is then subtracted from the input analogue signal of the analogue-digital converter. But this method requires the use of a digital-analogue converter having at least the same resolution as that of the analogue-digital converter. Moreover, the operation of subtracting the analogue signals is carried out at the input of the analogue-digital converter and generates a noise and a distortion of the analogue signal which disrupts the conversion.

Another technique consists in modifying the resolution of the analogue-digital converter so that the latter generates a digital word having a number of bits greater than or equal to the resolution of the converter. But this technique requires furnishing the converter with additional processing means that are complex and that consume more energy.

SUMMARY OF THE INVENTION

In one aspect, embodiments of the present invention provide for a method of processing an analogue signal comprising an analogue-digital conversion of the analogue signal to a digital signal within an analogue-digital converter with a pipelined architecture having an offset, and a compensation for the said offset. The method includes that the compensation comprises a digital correction of the integer portion of the offset made on the digital signal delivered by the analogue-digital converter and an analogue correction of the decimal portion of the offset made in the a last stage of the analogue-digital converter.

In another aspect, embodiments of the present invention provide for a method of converting an analogue signal to a digital signal comprising n bit words. The method includes the method comprising receiving the analogue signal and converting the analogue signal into a digital signal using a plurality of stages of an analogue-digital converter, wherein converting introduces an offset into the converted signal, the offset having an integer component and a decimal component. The method further includes digitally compensating for the integer component of the offset, and analogically compensating for the decimal component of the offset in the last stage of the plurality of stages of the analogue-digital converter.

In yet another aspect, embodiments of the present invention provide for an analogue to digital converter of n-bit resolution. The converter includes at least one first stage, having an input terminal configured to receive an analogue signal, a first output terminal configured to output a portion of the analogue signal converted into words of q bits where q is a whole number, and a second output terminal configured to transmit a residual analogue signal. The converter further includes a final stage, having an input terminal coupled to the output terminal of the at least one first stage and an output terminal configured to output the residual analogue signal converted into words of n–q bits, and a digital converter unit configured to receive the words of q bits and the words of n–q bits and to output digital n-bit words. The converter further includes a computing unit configured to determine an offset between the digital n-bit words and the analogue signal, wherein the offset has an integer portion and a decimal portion. A digital compensator is configured to subtract the integer portion of the offset from the n-bit words, and an analogue compensator is configured to receive the decimal portion of the offset and to generate therefrom a command signal to the last stage.

BRIEF DESCRIPTION OF THE DRAWINGS

Other advantages and features will appear on examination of the detailed description of embodiments and modes of application of the invention, which are in no way limiting, and of the appended drawings in which.

DETAILED DESCRIPTION OF ILLUSTRATIVE EMBODIMENTS

Figure 1:
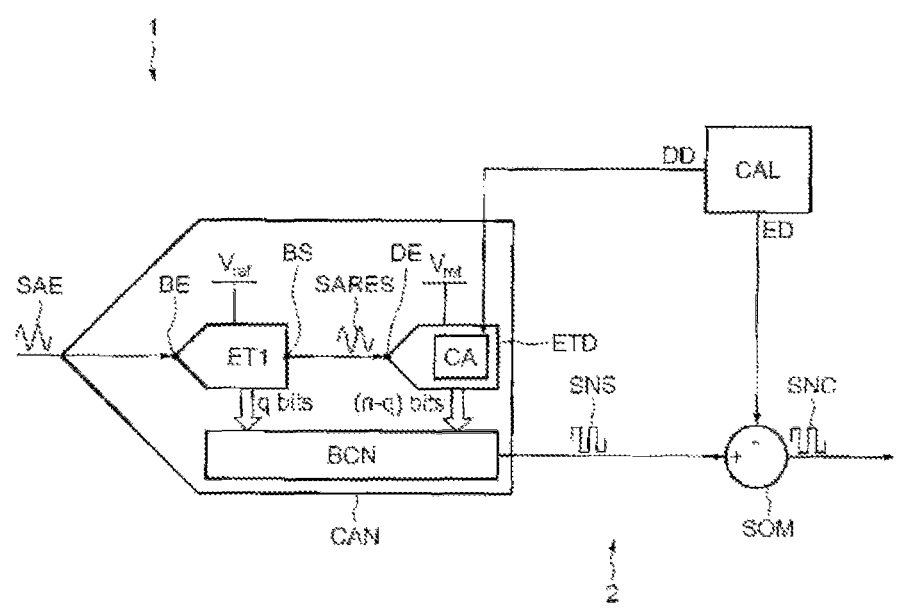
FIG. 1 illustrates schematically an embodiment of a device according to the invention.

Before addressing the illustrative embodiments in detail, the various embodiments and advantageous features thereof will be discussed generally in the following paragraphs.

According to one mode of application and embodiment, a correction means is proposed that has an accuracy greater than that of the analogue-digital converter used without it being necessary to modify the resolution of the latter.

According to another mode of application and embodiment, it is proposed to remove the operation of subtracting the analogue signals during the analogue-digital conversion.

According to one aspect, the proposal is therefore a method for processing an analogue signal comprising an analogue-digital conversion of the analogue signal to a digital signal within an analogue-digital converter with a pipelined architecture having an offset, and a compensation for the said offset.

The compensation for the offset comprises a digital correction of the integer portion of the offset made on the digital signal delivered by the analogue-digital converter and an analogue correction of the decimal portion of the offset made in the last stage of the analogue-digital converter.

Therefore, the corrections of the offset are separated so as not to have to carry out the operation of subtraction between the analogue signal and a correction analogue signal. In particular, the analogue correction is made in the last stage and does not disrupt the analogue-signal conversion carried out by the previous stages.

According to one mode of application, the digital correction comprises a subtraction of the integer portion of the offset of the digital signal delivered by the analogue-digital converter.

Therefore, the difference between the digital signal and the integer portion of the offset is carried out at the output of the analogue-digital converter and does not disrupt the digital signal. Moreover, the subtraction of digital signals is a stage that is simple to apply and that does not consume very much electric current.

According to another mode of application, the penultimate stage of the analogue-digital converter delivers a residual analogue signal in the direction of the last stage of the analogue-digital converter, the said last stage comprising several comparators configured to compare the residual analogue signal with respectively reference signals, and the analogue correction comprises a modification of the said reference signals as a function of the decimal portion of the offset.

It is therefore possible to modify the reference signals of the comparators so as to take account of the offset without carrying out a subtraction of analogue signals. Specifically, the subtraction (or addition) operation between a correction analogue signal and the residual analogue signal is substituted by a comparison of the residual analogue signal with a modified reference signal. The comparison of the signals may be a comparison of the levels of voltage, or of current, of the signals. Moreover, the modification of the reference signals may be an increase or a decrease, in current or in voltage, as a function of the value of the determined offset.

In particular, it is possible to modify these reference signals without modifying the reference voltage of the last stage so as to provide an analogue-digital converter that is stable.

According to another aspect, an analogue-signal processing device is proposed comprising an analogue-digital converter with a pipelined architecture having an offset, and compensation means configured to compensate for the said offset.

The compensation means comprise digital correction means configured to correct the integer portion of the offset based on the digital signal delivered by the analogue-digital converter, and analogue correction means included in the last stage of the analogue-digital converter and configured to correct the decimal portion of the offset.

According to one embodiment, the digital correction means comprise a summer capable of subtracting the integer portion of the offset of the digital signal delivered by the analogue-digital converter.

The device may comprise means for determining the offset, the said means being configured to determine an average between several measurements of offsets respectively obtained during several analogue-digital conversions.

According to another embodiment, the penultimate stage of the analogue-digital converter is configured to deliver a residual analogue signal in the direction of the last stage of the analogue-digital converter, the said last stage comprising several comparators configured to compare the residual analogue signal with respectively reference signals, and the analogue correction means are also configured to modify the reference signals as a function of the decimal portion of the offset.

According to one embodiment, each comparator of the last stage is a programmable threshold comparator configured to compare the residual analogue signal with the said programmable threshold, and the analogue correction means are also configured to modify the said programmable thresholds as a function of the decimal portion of the offset.

According to another embodiment, the said last stage comprises a programmable voltage divider bridge including a capacitor network coupled to a reference voltage and to several switches that can be selectively controlled and coupled respectively to the comparators, and the analogue correction means are configured to control the switches as a function of the decimal portion of the offset so as to modify the said reference signals.

According to yet another embodiment, the said last stage comprises a programmable voltage divider bridge including a resistor network coupled to a reference voltage and to several switches that can be selectively controlled and coupled respectively to the comparators, and the analogue correction means are configured to control the switches as a function of the decimal portion of the offset so as to modify the said reference signals.

Advantageously, the analogue-digital converter is of the n-bits type, the penultimate stage of the analogue-digital converter is capable of generating a digital number having a whole number q of bits, the said last stage is capable of generating a digital number having a whole number (n−q) of bits, the integer portion of the offset is a digital number having n bits and the last stage comprises $2^{n-q}-1$ comparators and $2^p$ switches per comparator, where p is a whole number.

Therefore a device is provided for which the correction of the offset is carried out with a voltage resolution that is lower than the voltage resolution of the analogue-digital converter, in other words the correction of the offset has an accuracy equal to n+p that is greater than that of the converter having an accuracy equal to n. Specifically, the voltage resolution of the analogue-digital converter is equal to $Vref/2^n$, where Vref corresponds to the reference voltage of the converter, while the voltage resolution of the correction is equal to $Vref/2^{n+p}$.

FIG. 1 shows schematically a device 1 for processing an analogue signal SAE comprising an analogue-digital converter with a pipelined architecture CAN having a resolution of n bits where n is a whole number. The converter CAN may comprise several stages. In a preferred embodiment, the converter CAN comprises a first stage ET1 having a resolution of q bits coupled to a last stage ETD with a resolution of (n−q) bits where q is a whole number. The first stage ET1 receives the analogue signal SAE and the converter CAN delivers as an output a corresponding digital signal SNS.

As an indication that is in no way limiting, the processing device 1 can be incorporated for example in a television set or a computer, the analogue signal SAE then being able for example to be a television signal.

The first stage ET1 comprises an input terminal BE to receive the analogue signal SAE and an output terminal BS designed to transmit a residual analogue signal SARES in the direction of the last stage ETD. This residual analogue signal SARES corresponds to the portion of the analogue signal that remains to be converted, the other portion having previously been converted into words of q bits. Moreover, the first stage ET1 has a track and hold unit, not shown in the figure for purposes of simplification, to sample the analogue signal SAE and to deliver the residual analogue signal SARES in the direction of the last stage ETD.

The last stage ETD samples the residual analogue signal SARES and delivers a word of (n−q) bits in the direction of a digital converter unit BCN. The last stage ETD comprises an input terminal DE coupled to the output terminal BS of the first stage ET1 and delivers the result of the conversion of the residual analogue signal in the direction of the digital converter unit BCN. Moreover, as will be seen in greater detail below, the last stage ETD comprises a programmable reference signal generator circuit CIP, for example programmable voltage thresholds or programmable current thresholds. Advantageously also provided are control means capable of programming the circuit to generate reference signals as a function of the offset to be corrected.

Moreover, the first stage ET1 delivers a word of q bits in the direction of the digital converter unit BCN. The words of the stages undergo a digital conversion by the BCN unit in order to form the output digital signal SNS that is made up of n-bit words.

The processing device 1 comprises a computing unit CAL designed to determine the offset of the digital signal SNS with the analogue signal SAE. The offset can be determined in advance, during the manufacture of the analogue-digital converter so as to calibrate the latter, or during its use in order to obtain a correction of the offset by taking account of the operating parameters of the converter, such as the variations in power supply, in temperature, taking account of the process for manufacturing the components of the converter, or the burning-in of these components. In order to determine this offset, it is possible to short-circuit the input terminal BE of the first stage, for example by coupling it to earth, then measuring the various values of the digital output signal of the unit BCN. With an ideal converter, a zero digital signal would be obtained corresponding to the fact that the input BE is coupled to earth. But in reality, it is possible to measure a non-zero digital signal as an average, for example words with a digital value of between 40 and 41 over a certain period are measured. This computing unit makes the average of the measured values and determines an offset D, for example D=40.96. This computing unit then determines the integer portion ED of the offset (in this instance equal to 40), and its decimal portion DD (in this instance equal to 96). The value of the offset of 40.96, cited in this instance as an example, is a theoretical value. The device and the method for correcting the offset described below completely correct the integer portion ED of the offset based on a digital correction and approximate the correction of the decimal portion DD. This approximation depends on the resolution of the last stage ETD.

The device 1 also comprises means 2 for compensating for the determined offset D. These compensation means 2 comprise a summer SOM which subtracts the value of the integer portion ED of the offset from the digital signal SNS in order to provide a corrected digital signal SNC of n bits. This subtraction is a digital operation that is not very complex and that requires little consumption of electricity. Therefore, a portion of the offset D is initially digitally corrected.

The compensation means 2 also comprise analogue correction means CA included in the last stage ETD. The analogue correction means CA are capable of controlling the programmable reference signal generator circuit CIP of the last stage ETD as a function of the value of the decimal portion DD of the offset. The analogue correction means CA convert the decimal portion DD into a digital command Cmd, for example with the aid of a correction table, then this digital command is transmitted to the reference signal generator circuit CIP.

The conversion table makes it possible to provide a command Cmd encoded on p bits, that is to say that the digital value of the command is between 0 and $2^p-1$. It is then said that the accuracy of the conversion table is equal to p. For example, when the accuracy of the conversion table is equal to 3 bits, if the decimal portion DD is equal to 96, the command Cmd is equal to 7.

Figure 2:
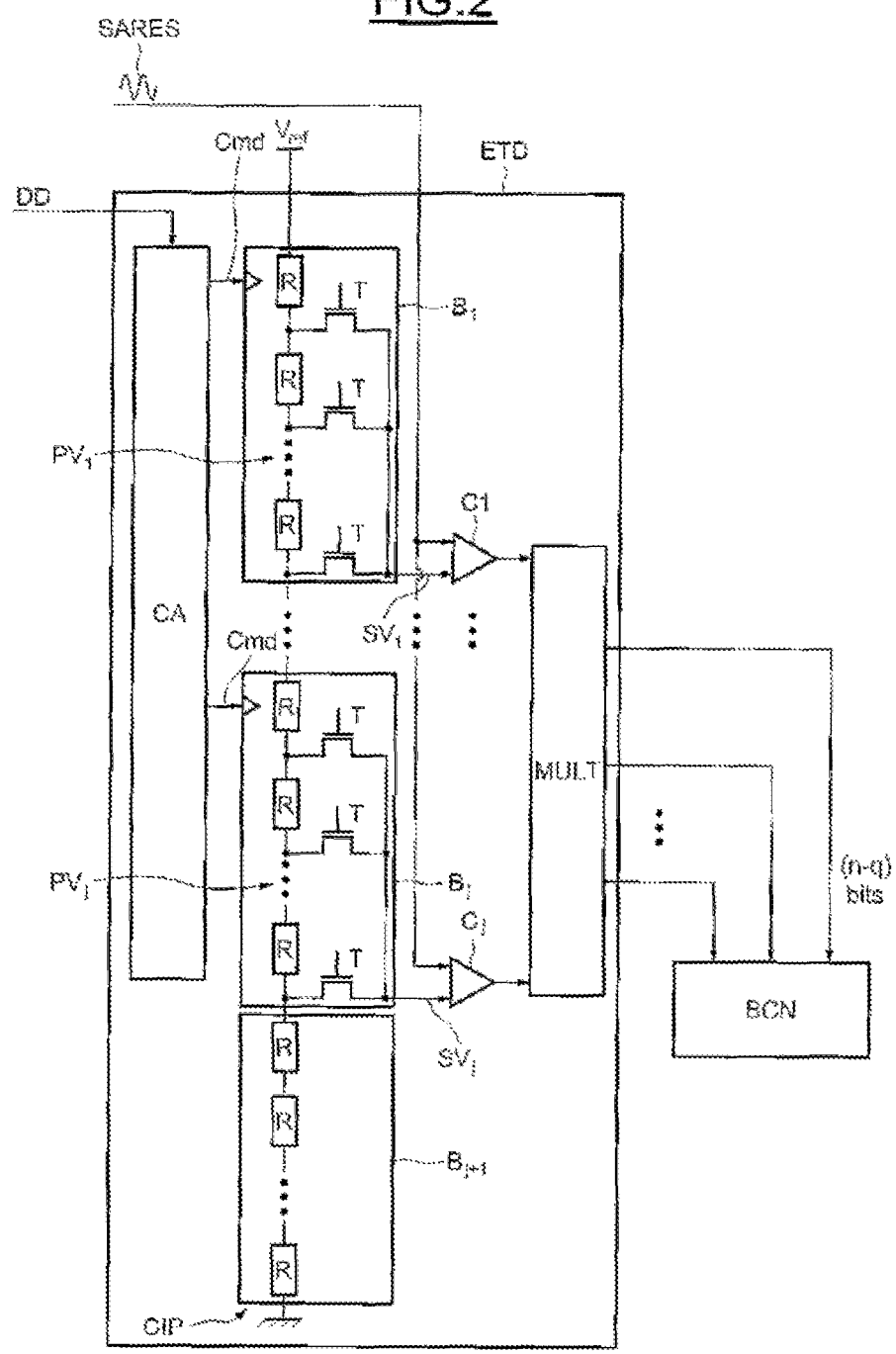
FIG. 2 illustrates schematically an exemplary embodiment of the last stage of the analogue-digital converter of the device of FIG. 1.

FIG. 2 illustrates schematically an embodiment of the last stage ETD of the analogue-digital converter CAN of the device 1 of FIG. 1. Also transferred to the figure are certain elements described above with reference to FIG. 1.

The last stage ETD is a resolution converter of (n−q) bits. In a preferred embodiment, this converter is of the "flash" type, that is to say that it comprises $j=2^{n-1}-1$ comparators C1 to Cj mounted in parallel. For example, if the analogue-digital converter has a resolution of n=12 bits and a first stage ET1 having a resolution of q=9 bits, then the last stage has a resolution of (n−q)=3 bits and comprises j=7 comparators. Each comparator C1 to Cj of the last stage ETD receives, on a first input, the residual analogue signal SARES and, on a second input, a reference signal delivered by the programmable reference signal generator circuit CIP. This reference signal generator circuit CIP comprises several programmable units B1 to Bj for delivering respectively several reference signals, and a last unit Bj+1. In particular, the circuit CIP comprises as many programmable units as there are comparators, namely $j=2^{n-q}-1$ programmable units. Each programmable unit is coupled to a comparator.

In one embodiment, the programmable reference signal generator circuit CIP may comprise a capacitor network in series configured to deliver reference signals respectively to the inputs of each comparator C1 to Cj of the last stage ETD. This capacitor network is coupled to the reference voltage Vref of the converter, to switches that can be selectively controlled and coupled respectively to the comparators C1 to Cj. Moreover, the analogue correction means CA are configured to control the said switches as a function of the decimal portion of the offset so as to modify the said reference signals.

In another embodiment, the last stage ETD may comprise comparators C1 to Cj with programmable reference signals, also called programmable threshold comparators. In this other embodiment, the analogue correction means CA are also configured to modify the said programmable thresholds as a function of the decimal portion of the offset.

In a preferred embodiment, shown in this instance in FIG. 2, each programmable unit of the circuit CIP comprises a programmable voltage divider bridge PVi including a resistor network coupled to a reference voltage and to several selectively controllable switches T. In particular, each programmable unit comprises a resistor network of $k=2^p$ resistors mounted in series and $k=2^p$ selectively controllable switches, where p represents the accuracy of the conversion table. The last unit $Bj+1$ is, for its part, not programmable and comprises only a resistor network of $k=2^p$ resistors mounted in series.

Therefore, each programmable unit is configured to deliver a different reference signal for each comparator C1 to Cj. In particular, each reference signal comprises a voltage threshold SVi, and each voltage threshold SVi is different for each comparator C1 to Cj. Each voltage threshold SVi is generated as a function of the command Cmd originating from the analogue correction means CA. Each programmable unit B1 to Bj receives the same command Cmd so that the input voltage thresholds of the comparators C1 to Cj are modified with the same voltage variation, called Vdeca or else correction voltage.

Moreover, each comparator transmits the result of its comparison in the direction of a multiplexer MULT which generates the words of (n q) bits for the digital converter unit BCN.

In normal operation, that is to say when no offset is corrected, the voltage thresholds are as follows:

$$SV1 = (Vref \cdot 7 \cdot 2^p \cdot R)/(8 \cdot 2^p \cdot R) = 7 \cdot Vref/8$$

$$\ldots$$

$$SV5 = (Vref \cdot 3 \cdot 2^p \cdot R)/(8 \cdot 2^p \cdot R) = 3 \cdot Vref/8$$

$$SV6 = (Vref \cdot 2 \cdot 2^p \cdot R)/(8 \cdot 2^p \cdot R) = 2 \cdot Vref/8$$

$$SV7 = (Vref \cdot 2^p \cdot R)/(8 \cdot 2^p \cdot R) = Vref/8$$

where SV1 is the voltage threshold applied to the second input of the first comparator C1, ..., SV5 is the voltage threshold applied to the second input of the fifth comparator C5, SV6 is the voltage threshold applied to the second input of the sixth comparator C6 and SV7 is the voltage threshold applied to the second input of the seventh and last comparator Cj. Where R is the value of the resistances of the programmable divider bridges PV1 to PVj.

Thus, each comparator makes a comparison between the voltage Vsares of the residual analogue signal and a voltage threshold SVi according to the following equation (1):

$$Vsares > SVi \qquad \text{(equation 1)}$$

where SVi is the voltage threshold applied to the second input of the comparator i (i is a whole number between 1 and $j=2^{n-q}-1$).

These voltage thresholds are then modified in order to correct the residual analogue signal SARES as a function of the decimal portion DD of the offset, according to the following equation (2):

$$Vsares > SVi + Vdeca \qquad \text{(equation 2)}$$

where
Vdeca is the correction voltage such that $Vdeca = Cmd \cdot Vref/(2^{n-q} \cdot 2^p)$ and where Cmd is the command provided by the analogue correction means CA.

This equation (2) is equivalent to the following equation (3):

$$Vsares - Vdeca > SVi \qquad \text{(equation 3)}$$

The modification of the voltage thresholds that consists in adding the correction voltage Vdeca to the voltage thresholds is equivalent to subtracting this same correction voltage from the residual analogue signal SARES.

In order to modify the voltage thresholds SVi as a function of the decimal portion DD of the offset, the analogue correction means CA transmit the digital command Cmd in the direction of each programmable unit B1 to Bj.

As a function of the received command Cmd, one of the switches T of each programmable unit becomes on state, the other switches remain off state, thus making it possible to provide a variable voltage threshold on the second input of the comparator associated with the programmable unit.

In the case cited above in which the analogue-digital converter CAN has a 12 bit resolution, the last stage ETD has a 3 bit resolution and the conversion table has an accuracy of 3 bits, and when the determined offset is equal to 40.96, the decimal portion (in this instance 96) of the offset D is corrected analogically. As has been said above, the correction of the decimal portion DD is approximated as a function of the resolution of the last stage ETD. In this case, the resolution of the last stage ETD being equal to 3 bits, an offset of 40.875 is corrected, which corresponds to the approximation of the theoretical offset equal to 40.96.

The decimal portion DD is converted to the digital command Cmd, in this instance equal to 7. This digital command Cmd controls each switch of the programmable units so as to obtain the correction voltage $Vdeca = Cmd \cdot Vref/(2^{n-q} \cdot 2^p) = 7 \cdot Vref/8$. In other words, if the reference voltage Vref of the converter is equal to 1 volt, then the correction voltage Vdeca is equal to 0.875 volts. During the analogue correction of the decimal portion of the offset, the correction of the decimal portion of the offset is approximated at a digital value equal to 0.875.

It is therefore possible to increase the accuracy of the correction of the offset by increasing the resolution of the last stage of the converter.

Increasing the voltage thresholds SVi by a value equal to the correction voltage Vdeca, according to the equation (1), is therefore equivalent to subtracting the correction voltage Vdeca from the residual analogue signal SARES.

In conclusion, the integer portion of the offset, in this instance equal to 40, is subtracted from the output digital signal SNS and the correction voltage Vdeca, in this instance equal to $7 \cdot Vref/8$, is subtracted from the residual analogue signal SARES, in order to approximate the correction of the decimal portion of the determined offset DD, in this instance equal to 40.96.

Generally, when a conversion table is used with an accuracy of p bits and $k=2^p$ switches are used per programmable unit, an accuracy of the correction of the offset equal to $Vref/(2^n \cdot 2^p)$ is obtained which is more accurate than that of the analogue-digital converter which is equal to $Vref/(2^n)$.

The principle is therefore to modify the input reference signals of the comparators of the last stage ETD in order to correct the decimal portion DD of the offset without modifying the input residual analogue signal of the last stage, and without modifying the resolution of the analogue-digital converter. This prevents having to summate the residual analogue signal SARES with a correction voltage.

Advantageously, the stages of the analogue-digital converter are powered by the same reference voltage Vref, which provides a stable processing device.

By virtue of such a processing device, the accuracy of the correction of the digital signal offset is improved without modifying the analogue signal to be converted. It also dispenses with using a digital-analogue converter for making the correction of the offset.

What is claimed is:

1. A method for processing an analogue signal comprising an analogue-digital conversion of the analogue signal to a digital signal within an analogue-digital converter with a pipelined architecture having an offset, and a compensation for said offset, characterized in that said compensation comprises a digital correction of an integer portion of the offset made on the digital signal delivered by the analogue-digital converter and an analogue correction of a decimal portion of the offset made in a last stage of the analogue-digital converter.

2. The method according to claim 1, in which the digital correction comprises a subtraction of the integer portion of the offset of the digital signal delivered by the analogue-digital converter.

3. The method according to claim 1, in which the penultimate stage of the analogue-digital converter delivers a residual analogue signal in the direction of the last stage of the analogue-digital converter, said last stage comprising a plurality of comparators configured to compare the residual analogue signal with respective reference signals, and wherein the analogue correction comprises a modification of said respective reference signals as a function of the decimal portion of the offset.

4. A device for processing an analogue signal, comprising an analogue-digital converter with a pipelined architecture having an offset, and compensation means configured to compensate for said offset, characterized in that said compensation means comprise digital correction means configured to correct an integer portion of the offset based on the digital signal delivered by the analogue-digital converter, and analogue correction means included in the last stage of the analogue-digital converter and configured to correct a decimal portion of the offset.

5. The device according to claim 4, in which the digital correction means comprise a summer capable of subtracting the integer portion of the offset of the digital signal delivered by the analogue-digital converter.

6. The device according to claim 4, in which the penultimate stage of the analogue-digital converter is configured to deliver a residual analogue signal in the direction of the last stage of the analogue-digital converter, the said last stage comprising a plurality of comparators configured to compare the residual analogue signal with respective reference signals, and the analogue correction means are also configured to modify the respective reference signals as a function of the decimal portion of the offset.

7. The device according to claim 6, in which each comparator of the last stage is a programmable threshold comparator configured to compare the residual analogue signal with said programmable threshold, and the analogue correction means are also configured to modify the said programmable thresholds as a function of the decimal portion of the offset.

8. The device according to claim 6, in which the said last stage comprises a programmable voltage divider bridge including a capacitor network coupled to a reference voltage and to several switches that can be selectively controlled and coupled respectively to the comparators, and the analogue correction means are configured to control the switches as a function of the decimal portion of the offset so as to modify said reference signals.

9. The device according to claim 6, in which the said last stage comprises a programmable voltage divider bridge including a resistor network coupled to a reference voltage and to several switches that can be selectively controlled and coupled respectively to the comparators, and the analogue correction means are configured to control the switches as a function of the decimal portion of the offset so as to modify said reference signals.

10. The device according claim 4, in which the analogue-digital converter is of n-bits resolution, the penultimate stage of the analogue-digital converter is capable of generating a digital number having a whole number q of bits, the said last stage is capable of generating a digital number having a whole number (n–q) of bits, the integer portion of the offset is a digital number having n bits and the said last stage comprises $2^{n-q}-1$ comparators and $2^p$ switches per comparator, where p is a whole number.

11. A method of converting an analogue signal to a digital signal comprising n bit words, the method comprising:
   receiving the analogue signal;
   converting the analogue signal into a digital signal using a plurality of stages of an analogue-digital converter, wherein converting introduces an offset into the converted signal, the offset having an integer component and a decimal component;
   digitally compensating for the integer component of the offset; and
   analogically compensating for the decimal component of the offset in the last stage of the plurality of stages of the analogue-digital converter.

12. The method of claim 11 further comprising determining the offset.

13. The method of claim 12 wherein the offset is determined by applying a zero voltage analogue signal and measuring a corresponding converted digital signal.

14. The method of claim 11 wherein digitally compensating for the integer component of the offset comprises subtracting a digital value from an output of the analogue-digital converter.

15. The method of claim 11 wherein analogically compensating for the decimal component of the offset comprises subtracting a voltage corresponding to the decimal component from a residual analogue signal passed to the last stage of the plurality of stages of the analogue-digital converter.

16. An analogue to digital converter of n-bit resolution comprising:
   at least one first stage, having an input terminal configured to receive an analogue signal, a first output terminal configured to output a portion of the analogue signal converted into words of q bits where q is a whole number, and a second output terminal configured to transmit a residual analogue signal;
   a final stage, having an input terminal coupled to the output terminal of the at least one first stage and an output terminal configured to output the residual analogue signal converted into words of n–q bits;
   a digital converter unit configured to receive the words of q bits and the words of n–q bits and to output digital n-bit words;
   a computing unit configured to determine an offset between the digital n-bit words and the analogue signal, wherein the offset has an integer portion and a decimal portion;
   a digital compensator, configured to subtract the integer portion of the offset from the n-bit words; and
   an analogue compensator configured to receive the decimal portion of the offset and to generate therefrom a command signal to the last stage.

17. The analogue to digital converter of claim 16 wherein the last stage comprises a plurality of comparators, each comparator configured to compare the residual analogue signal with a reference voltage, and wherein the command signal adjusts the reference voltage for at least one of the plurality of comparators.

18. The analogue to digital converter of claim 16 wherein the at least one first stage comprises a plurality of first stages in a pipeline configuration.

19. The analogue to digital converter of claim 16 wherein the analogue compensator further includes a plurality of voltage dividers, one for each comparator, each voltage divider configured to receive a primary reference voltage and the command and to output therefrom the reference voltage.

20. The analogue to digital converter of claim 19 wherein each voltage divider comprises a resistor network coupled to the primary reference voltage and a plurality of selectable switches.

* * * * *